(12) United States Patent
Chen et al.

(10) Patent No.: US 7,798,581 B2
(45) Date of Patent: Sep. 21, 2010

(54) FAST DETACHABLE SLIDE BRACKET

(75) Inventors: Ken-Ching Chen, Kaohsiung Hsien (TW); Wei-Sheng Wang, Kaohsiung Hsien (TW); I-Ming Tseng, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 738 days.

(21) Appl. No.: 11/709,089

(22) Filed: Feb. 22, 2007

(65) Prior Publication Data

US 2008/0203251 A1    Aug. 28, 2008

(51) Int. Cl.
*A47G 29/00* (2006.01)

(52) U.S. Cl. ............ 312/265.1; 312/334.4; 248/220.41; 211/26

(58) Field of Classification Search ............ 248/220.41, 248/220.43, 221.11, 222.11; 211/26, 191, 211/175, 192; 312/223.2, 265.4, 265.1, 265.2, 312/265.3, 334.4, 334.5
See application file for complete search history.

(56) References Cited

U.S. PATENT DOCUMENTS

| | | | |
|---|---|---|---|
| 5,571,256 A | 11/1996 | Good et al. | |
| 5,791,498 A | 8/1998 | Mills | |
| 5,833,337 A | 11/1998 | Kofstad | |
| 6,021,909 A | 2/2000 | Tang et al. | |
| 6,070,957 A | 6/2000 | Zachrai | |
| 6,230,903 B1 | 5/2001 | Abbott | |
| 6,269,959 B1 | 8/2001 | Haworth | |
| 6,422,399 B1 | 7/2002 | Castillo | |
| 6,431,668 B1 | 8/2002 | Reddicliffe | |
| 6,442,030 B1 | 8/2002 | Mammoser et al. | |
| 6,554,142 B2 | 4/2003 | Gray | |
| 6,609,619 B2 * | 8/2003 | Abbott | ........................ 211/26 |
| 6,659,577 B2 | 12/2003 | Lauchner | |
| 6,666,340 B2 | 12/2003 | Basinger et al. | |
| 6,681,942 B2 | 1/2004 | Haney | |
| 6,702,124 B2 | 3/2004 | Lauchner et al. | |
| 6,726,164 B1 | 4/2004 | Baiza et al. | |
| 6,749,275 B2 | 6/2004 | Cutler et al. | |
| 6,773,080 B2 * | 8/2004 | Chen et al. ............... | 312/265.1 |
| 6,840,388 B2 | 1/2005 | Mayer | |

(Continued)

FOREIGN PATENT DOCUMENTS

TW    M281520    12/2005

(Continued)

*Primary Examiner*—Gwendolyn Baxter
(74) *Attorney, Agent, or Firm*—Rosenberg, Klein & Lee

(57) ABSTRACT

A fast detachable slide bracket includes a frame, a resilient latching member, and a linkage. A folded plate having a through hole is disposed at one end of the frame. The resilient latching member has a first end and a second end opposite to each other. The section between the first end and the second end is pivotally connected to the frame. The first end is relatively disposed to and separated from the folded plate for a proper range. The linkage has a first end and a second end opposite to each other. The first end of the linkage penetrates the through hold of the folded plate of the frame and the second end of the linkage links the latching member to raise the second end of the latching member thus to move the first end of the latching member to release the bracket from a support temporarily.

8 Claims, 6 Drawing Sheets

U.S. PATENT DOCUMENTS

| | | | |
|---|---|---|---|
| 6,866,154 B2 | 3/2005 | Hartman et al. | |
| 6,871,920 B2 | 3/2005 | Greenwald et al. | |
| 6,891,727 B2 | 5/2005 | Dittus et al. | |
| 6,926,378 B2 | 8/2005 | Greenwald et al. | |
| 6,929,339 B1 | 8/2005 | Greenwald et al. | |
| 6,930,886 B2 | 8/2005 | Velez et al. | |
| 6,948,691 B2 | 9/2005 | Brock et al. | |
| 6,974,037 B2 | 12/2005 | Haney | |
| 6,988,626 B2 | 1/2006 | Varghese et al. | |
| 7,012,808 B2 | 3/2006 | Mayer | |
| 7,093,725 B2 | 8/2006 | Hartman et al. | |
| 7,552,899 B2 * | 6/2009 | Chen et al. | 248/224.8 |
| 7,677,680 B1 * | 3/2010 | Chang | 312/333 |
| 7,699,279 B2 * | 4/2010 | Chen et al. | 248/220.41 |
| 2004/0016712 A1 | 1/2004 | Hamilton | |
| 2005/0285492 A1 | 12/2005 | Hu et al. | |
| 2006/0152115 A1 | 7/2006 | Dubon et al. | |

FOREIGN PATENT DOCUMENTS

| | | |
|---|---|---|
| TW | M281525 | 12/2005 |

* cited by examiner

FAST DETACHABLE SLIDE BRACKET

BACKGROUND OF THE INVENTION (a) Field of the Invention

The present invention relates to a fast detachable slide bracket, and more particularly, to one that releases the bracket by means of a linkage linking a resilient latching member without the necessity to use any tool.

(b) Description of the Prior Art

A slide incorporated with a bracket to facilitate locking the slide to a metallic support is commonly observed in a rack mounted computer system. Design of this type of slide bracket is comparatively diversified and is currently dominated by fast detachable and tool free as taught in U.S. Pat. Nos. 6,659,577 B2, and 6,891,727 B2; Early Publication No. 2006/0152115 A1; and Taiwan Patent Nos. M281520, and M281525.

However, in all the prior art, attempted removal of the bracket when secured must be done from either side of the bracket, meaning it allows the user to stretch one hand from the front of the bracket and then bend his wrist to the side to release a latching member when no other set of slide and bracket are not installed either on top of or below the bracket. It becomes very inconvenient and difficult if only one set of slide and bracket to be removed among all the sets of slide and bracket closely and longitudinally arranged.

SUMMARY OF THE INVENTION

The primary purpose of the present invention is to provide a fast retractable slide bracket without depending on any tool or subject to limited space to correct the problems found with the prior art.

To achieve the purpose, a fast retractable slide bracket of the present invention includes a frame disposed at one end a folded plate containing a through hole; a resilient latching member provided with a first end and a second end opposite to each other with a section between both ends pivoted to the frame, and the first end being at where in relation to the folded plate of the frame to separate from the folded plate a certain range; and a linkage also provided with a first end and a second end opposite to each other, the first end penetrating the through hole of the folded plate of the frame and the second end linking the resilient latching member to raise the second end of the resilient latching member thus to move the first end of the resilient latching member.

Wherein, the resilient latching member is provided with an elastic element to hold against the resilient latching member and the frame so to have the first end of the resilient latching member to be at where in relation to the folded plate of the frame.

Wherein, the resilient latching member is provided with an outer cover, and the outer cover is provided with an elastic plate to hold against the second end of the resilient latching member thus to maintain the first end of the resilient latching member at where in relation to the folded plate of the frame.

The second end of the linkage is linked to a sliding block, and the sliding block is in turn linked to the resilient latching member to raise the second end of the resilient latching member to move the first end of the resilient latching member.

The sliding block is provided with a first end and a second end opposite to each other with the first end corresponding to the resilient latching member, and the second end of the sliding block is disposed with a pull plate.

The sliding block is further disposed with two ears to be inserted into and slide in slots disposed in the linkage with the inner edges biting the ears of the sliding block to move the sliding block.

The slots of the linkage are made longer than the ears of the sliding block.

The ear of the sliding block when located in the slot maintains a proper distance from both ends of the slot.

Accordingly, the present invention provides the following advantages:

1. It allows easy and fast unlatching and releasing without depending on any tool.
2. It allows safe, free and comfortable operation with having to stick fingers into the support.
3. It allows direct operation of the linkage when enough space is provided thus to provide more convenient operation with diversified options.

DETAILED DESCRIPTION OF THE PREFERRED EMBODIMENTS

Figure 1:
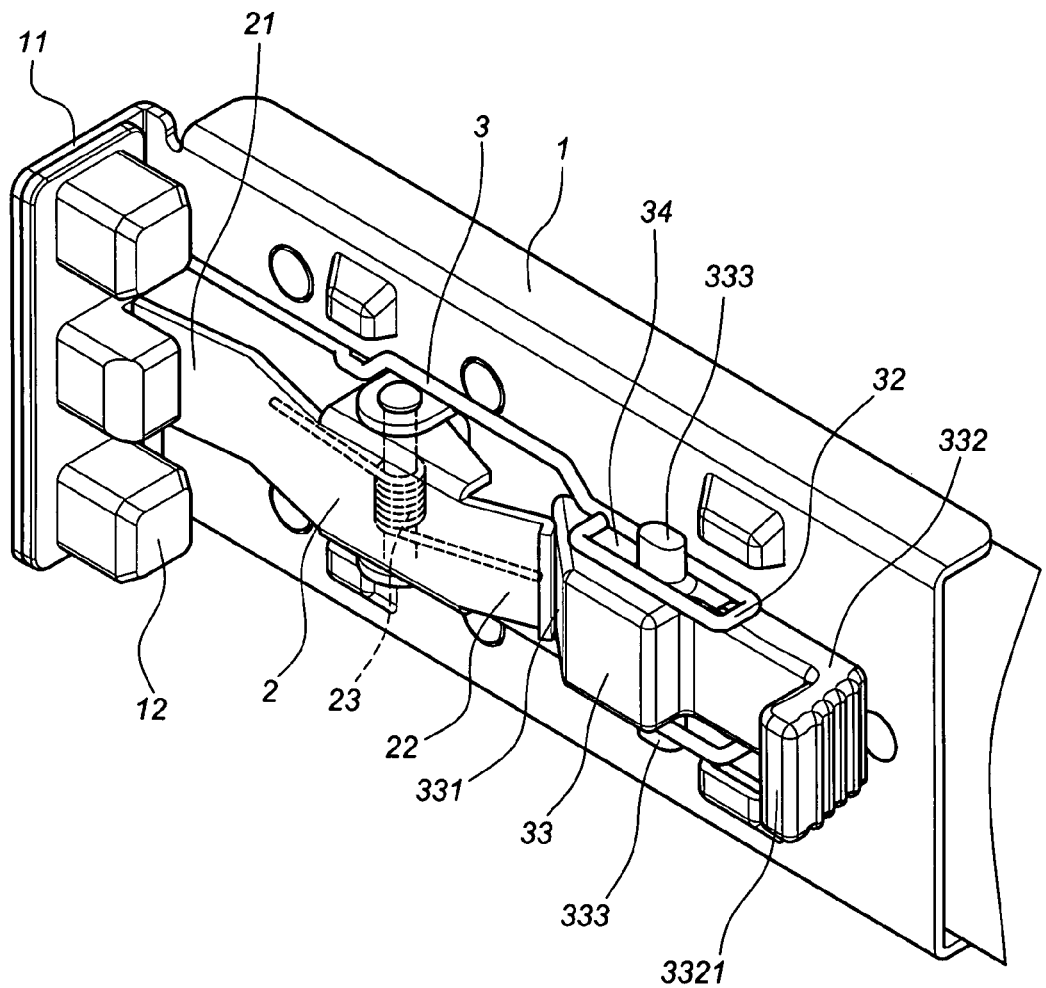
FIG. 1 is a perspective view of a preferred embodiment of the present invention [when seen in the direction of the inner side of a frame (1) of a bracket].
Figure 2:
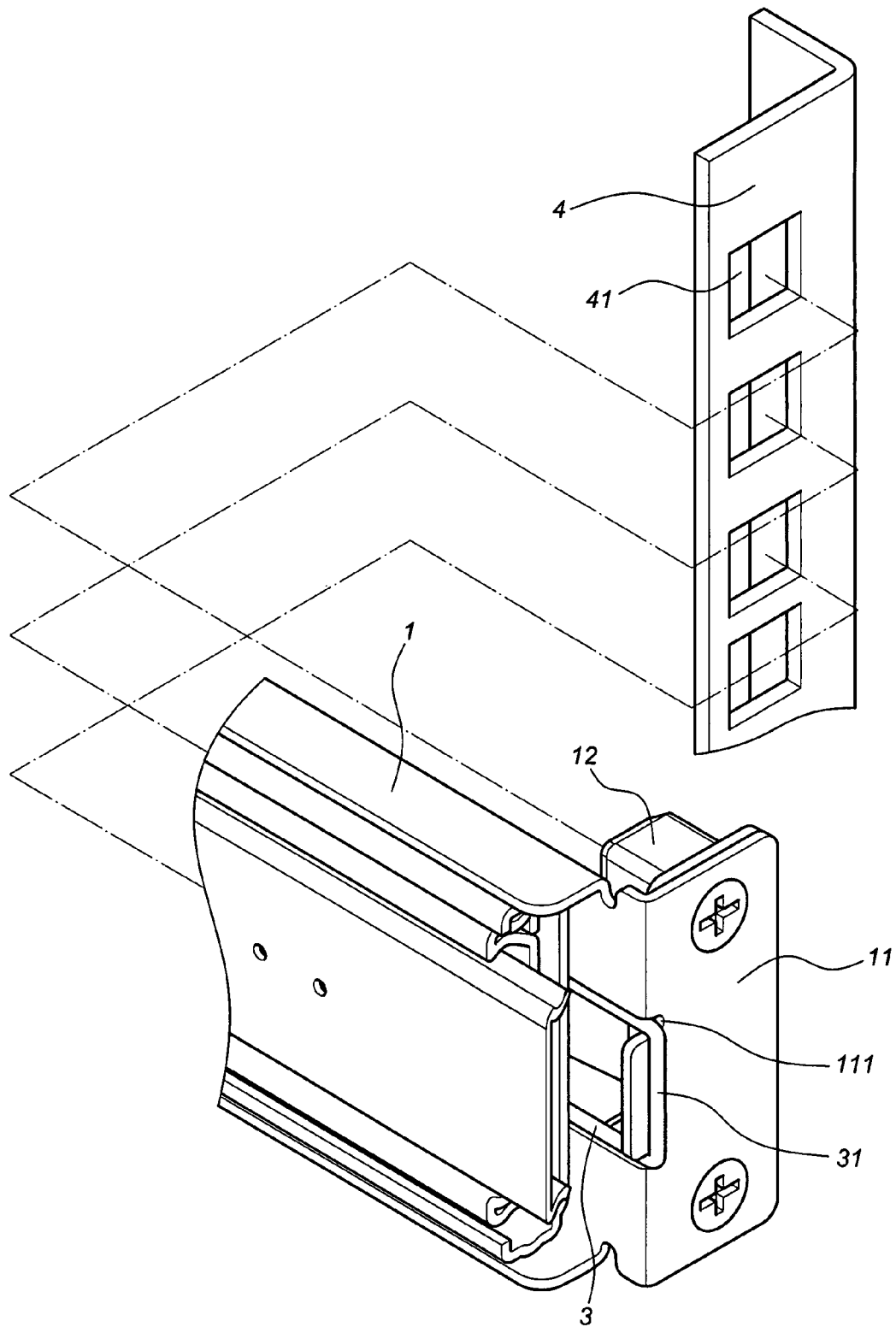
FIG. 2 is a schematic view showing a relation between the preferred embodiment of the present invention and a support [when seen in the direction from an outer side of a support (4) into the frame (1)].
Figure 3:
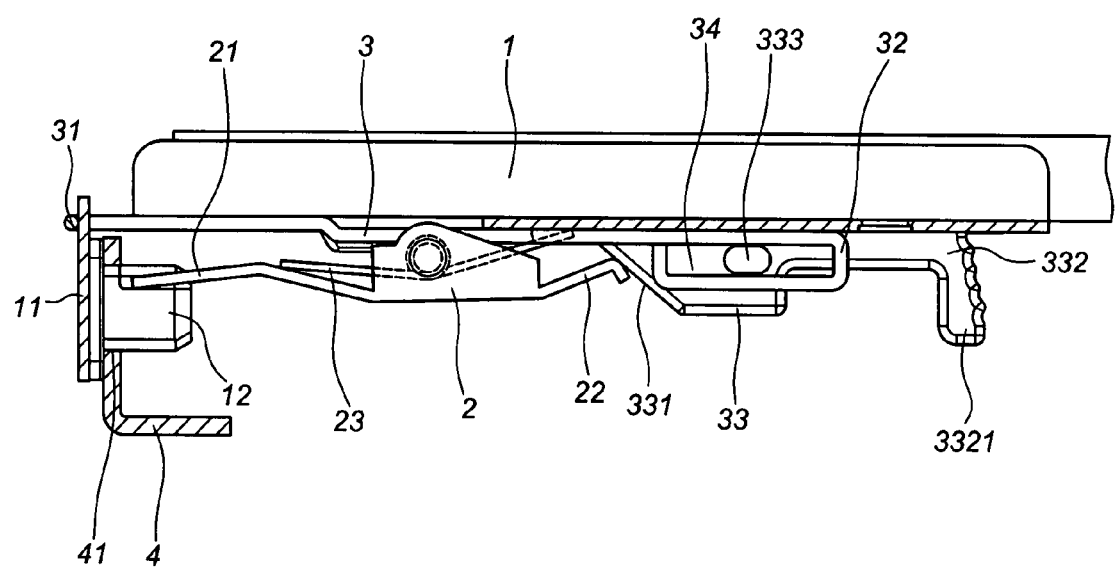
FIG. 3 is a top view of the preferred embodiment of the present invention mounted to the support.

Referring to FIGS. 1 through 3, a preferred embodiment of the present invention comprises a frame (1), a resilient latching member (2), and a linkage (3).

The frame (1) is disposed on its one end a folded plate (11). The folded plate (11) has a through hole (111). Insertion posts (12) are fixedly connected to the folded plate (11).

The resilient latching member (2) has a first end (21) and a second end (22) opposite to each other. The section between the first end (21) and the second end (22) is pivotally connected to the frame (1). The first end (21) is disposed at where in relation to and separated from the folded plate (11) of the frame (1) for a certain range. The resilient latching member (2) is provided with an elastic element (23) to hold against the resilient latching member (2) and the frame (1) thus for maintaining the first end (21) of the resilient latching member (2) at where in relation to the folded plate (11) of the frame (1).

The linkage (3) has a first end (31) and a second end (32) opposite to each other. The first end (31) penetrates the through hole (111) of the folded plate (11) of the frame (1). The second end (32) is to link the resilient latching member (2) to raise the second end (22) of the resilient latching member (2) and to further move the first end (21) of the resilient latching member (2). In the preferred embodiment, the second end (32) of the linkage (3) is connected with a sliding block (33), and the sliding block (33) is further connected to the resilient latching member (2) so to raise the second end (22) of the resilient latching member (2) to further move the first end (21) of the resilient latching member (2). The sliding block (33) has a first end (331) and a second end (332). The first end (331) corresponds in position to the resilient latching member (2) and the second end (332) is provided with a pull plate (3321).

The sliding block (33) is provided with two ears (333), and the linkage (3) is disposed with a pair of slots (34) for insertion and sliding of the ears (333). Inner edges of the slots (34) bite the ears (333) for the linkage (3) to link the sliding block (33). The length of the slot (34) of the linkage (3) is longer than that of the ear (333). Meanwhile, each ear (333) resting in the slot (34) maintains a certain range from both ends of the slot (34). The linkage (3) is an enclosed rectangular-like rod containing the two strip slots (34), and each ear (333) rests in the slot (34) to yield enough space for the linkage (3) to operate in two operating modes to be described hereinafter.

The preferred embodiment of the present invention, i.e., a bracket represented by the frame (1) operates in conjunction with a support (4). The support (4) is provided with insertion holes (41) to receive insertion of the insertion posts (12) of the frame (1).

Figure 4:
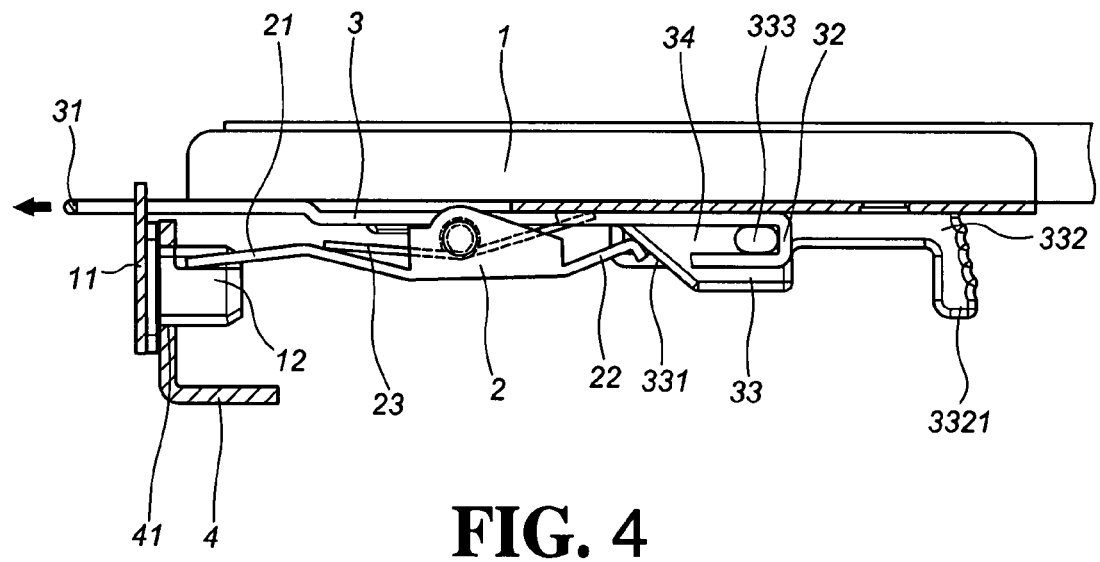
FIG. 4 is a schematic view showing an operation to unlatch executed externally to the support [with a first end (31) merely exposed when the front end of a linkage (3) is pulled out].
Figure 5:
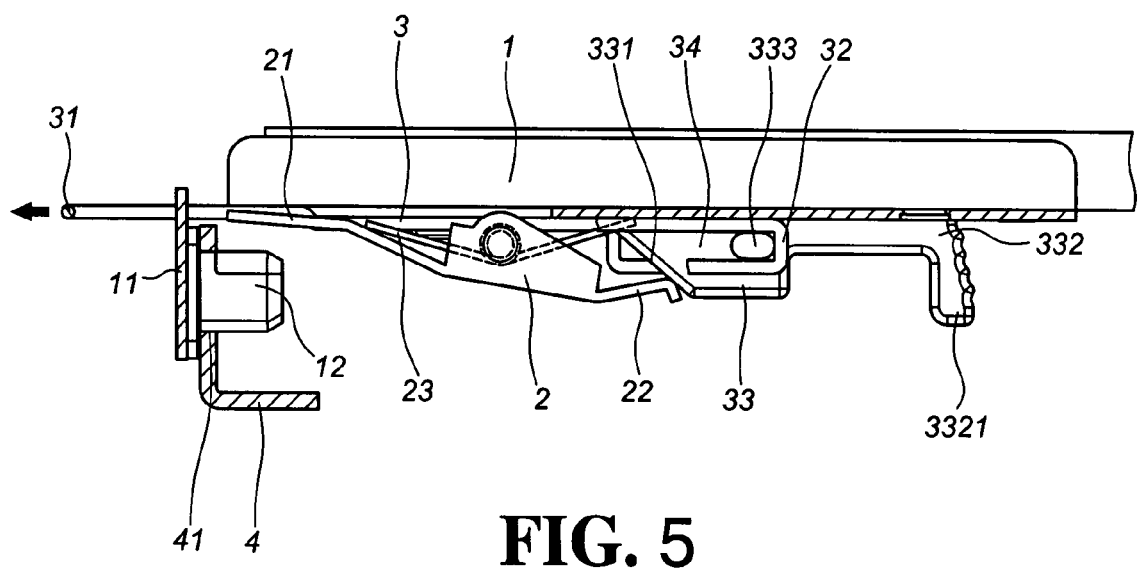
FIG. 5 is another schematic view showing the operation to unlatch executed externally to the support [with the first end (31) being pulled to further pull out the linkage (3)].

As illustrated in FIG. 3, the preferred embodiment of the present invention is mounted to the support (4). When the bracket represented by the frame (1) is to be unlatched externally to the support (4), the front end of the linkage (3) is just pulled out to expose the first end (31) as illustrated in FIG. 4. The slot (34) has its inner edge to bite the ear (333). As the first end (31) is further pulled (31) to pull out the linkage (3) as illustrated in FIG. 5, the sliding block (33) connected to the linkage (3) moves to push against and raise the second end (22) of the resilient latching member (2) for the first end (21) of the resilient latching member (2) to move in opposite direction thus to clear away from the support (4) to remove the frame (1).

Figure 6:
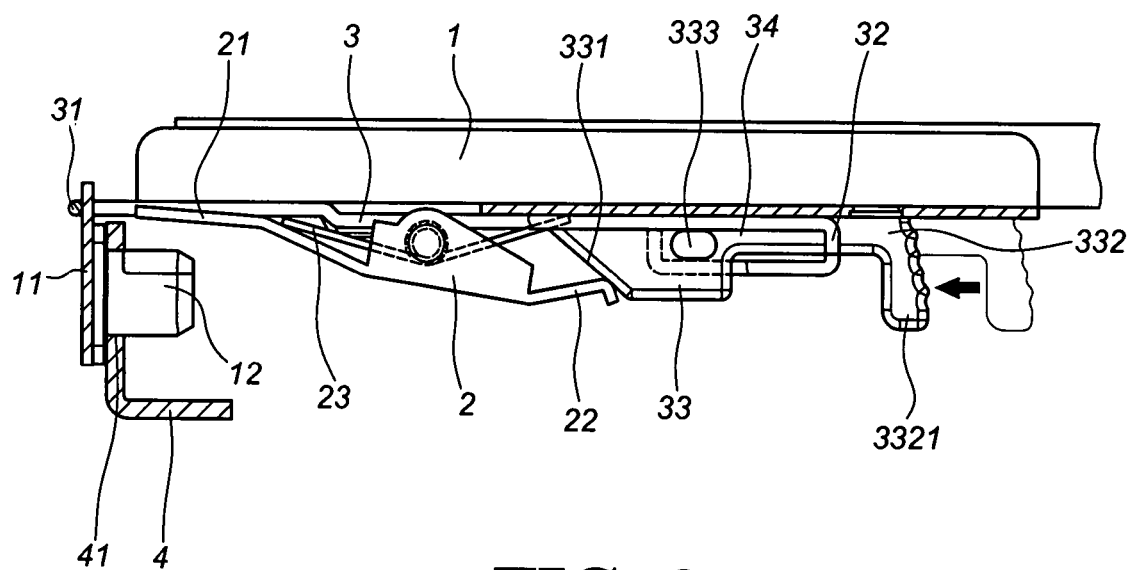
FIG. 6 is a schematic view showing an operation to unlatch is executed internally to the support [with a pull plate (3321) of the linkage (3) pushed and pulled for the linkage (3) to push up a resilient latching member (2)].

When there is enough space available as illustrated in FIG. 6 (since no object is installed on the bracket), the pull plate (3321) of the sliding block (33) is pushed and pulled for the linkage (3) to directly push up the second end (22) of the resilient latching member (2). In the course of pushing up the linkage (3), a space from the front section of each slot (34) becomes available for the ear (333) to slide thus to prevent the first end (31) of the linkage (3) from being ejected before the resilient latching member (2) is unlatched.

Figure 7:
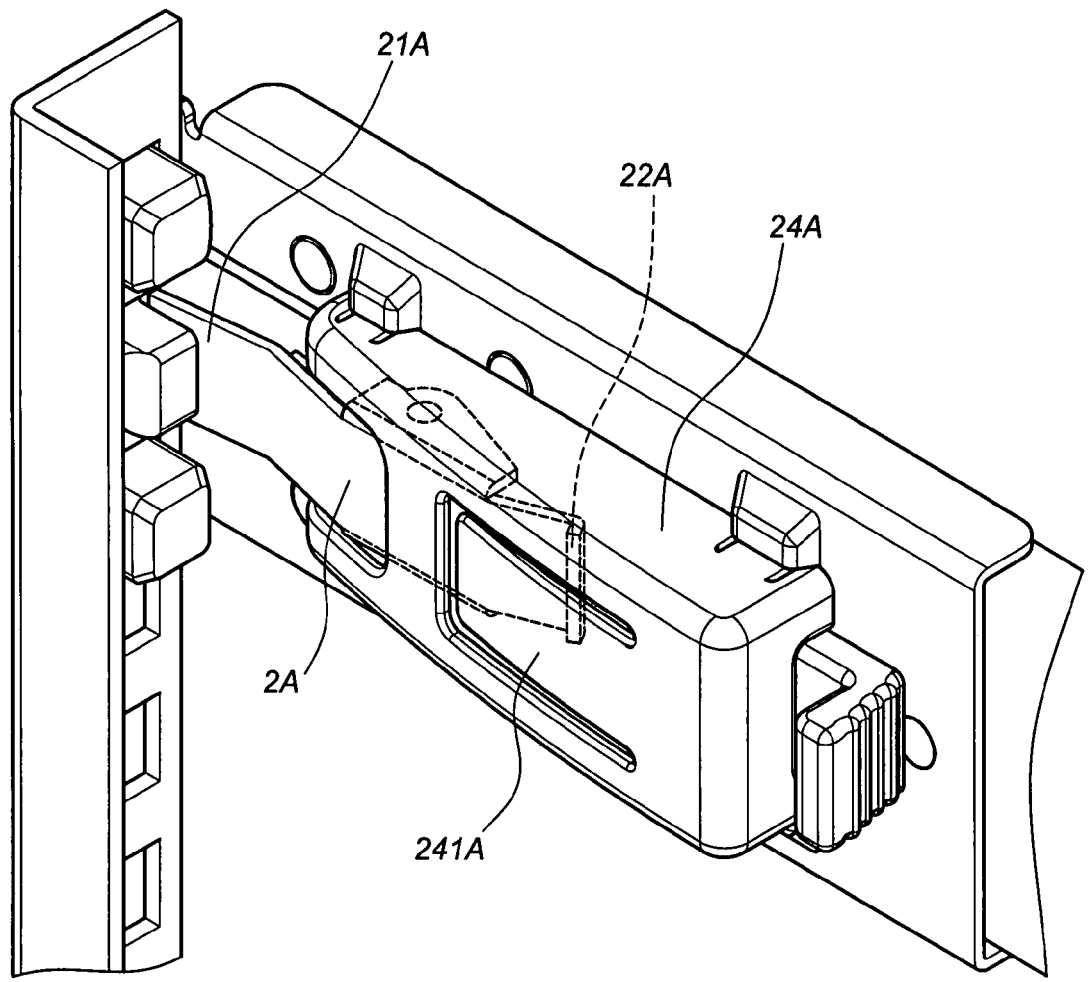
FIG. 7 is a perspective view showing an assembly of another preferred embodiment of the present invention [showing an appearance of an outer cover (24A) of a resilient latching member (2A)].

Other options are available for the operation mode for the elastic element (23) of the resilient latching member (2). As illustrated in FIG. 7 for a perspective view of an assembly of another preferred embodiment of the present invention, an resilient latching member (2A) is provided with an outer cover (24A), and the outer cover (24A) is provided with an elastic plate (241A) to hold against a second end (22A) of the resilient latching member (2A) so to maintain a first end (21A) of the resilient latching member (2A) at where in relation to the folded plate (11) of the frame (1).

What is claimed is:

1. A fast retractable slide bracket, comprising:
   a frame provided with a folded plate at one end thereof, the folded plate having a through hole;
   an resilient latching member having a first end and a second end opposite to each other, a section between the first end and the second end being pivotally connected to the frame, the first end corresponding to the folded plate and being separated for a distance from the folded plate; and
   a linkage having a first end and a second end opposite to each other, the first end penetrating the through hole of the folded plate of the frame, the second end linking the resilient latching member to raise the second end of the resilient latching member and further to move the first end of the resilient latching member.

2. The fast retractable slide bracket as claimed in claim 1, wherein the resilient latching member is provided with an elastic element to hold against the resilient latching member and the frame thus to maintain the first end of the resilient latching member corresponding to the folded plate of the frame.

3. The fast retractable slide bracket as claimed in claim 1, wherein the resilient latching member is provided with an outer cover, the outer cover being provided with an elastic plate to hold against the second end of the resilient latching member thus to maintain the first end of the resilient latching member corresponding to the folded plate of the frame.

4. The fast retractable slide bracket as claimed in claim 1, wherein the second end of the linkage is connected to a sliding block, the sliding block linking the resilient latching member to raise the second end of the resilient latching member and to move the first end of the resilient latching member.

5. The fast retractable slide bracket as claimed in claim 4, wherein the sliding block has a first end and a second end opposite to each other, the first end of the sliding block corresponding to the resilient latching member and the second end of the sliding block being provided with a pull plate.

6. The fast retractable slide bracket as claimed in claim 4, wherein the sliding block is provided with two ears and the linkage is disposed with two corresponding slots for insertion and sliding of the ears, inner edges of the slots biting the ears for the linkage to move the sliding block.

7. The fast retractable slide bracket as claimed in claim 6, wherein the slots are made longer than the ears.

8. The fast retractable slide bracket as claimed in claim 7, wherein the ears are located in the slots and separated for a distance from two ends of each of the slots.

* * * * *